(12) United States Patent  (10) Patent No.: US 7,697,085 B2
Kim  (45) Date of Patent: Apr. 13, 2010

(54) LIQUID CRYSTAL DISPLAY

(75) Inventor: Tae Hyuck Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 448 days.

(21) Appl. No.: 11/892,300

(22) Filed: Aug. 21, 2007

(65) Prior Publication Data

US 2008/0055512 A1 Mar. 6, 2008

(30) Foreign Application Priority Data

Aug. 31, 2006 (KR) .................. 10-2006-0083400

(51) Int. Cl.
*G02F 1/1333* (2006.01)
(52) U.S. Cl. .......................................... 349/58; 349/59
(58) Field of Classification Search ............... 349/58, 349/59, 70, 149; 361/679.21, 679.22, 679.26, 361/800, 816, 818; 362/631, 632, 633, 97.2
See application file for complete search history.

(56) References Cited

U.S. PATENT DOCUMENTS

| 7,230,659 | B2 * | 6/2007 | Ha et al. ........................ 349/58 |
| 2002/0057405 | A1 * | 5/2002 | Morishita et al. ........... 349/113 |
| 2006/0066774 | A1 * | 3/2006 | Kim et al. ..................... 349/65 |
| 2007/0279545 | A1 * | 12/2007 | Jang ............................ 349/56 |

\* cited by examiner

*Primary Examiner*—Dung Nguyen
*Assistant Examiner*—Tai Duong
(74) *Attorney, Agent, or Firm*—McKenna Long & Aldridge LLP

(57) ABSTRACT

A liquid crystal display is disclosed. The liquid crystal display comprises: a liquid crystal panel; a bottom cover disposed on the back surface of the liquid crystal panel and mounting and supporting the liquid crystal panel; a printed circuit board disposed on the back surface of the bottom cover; and a cover shield fastened to the bottom cover and the printed circuit board so as to cover the printed circuit board and comprising at least two depressed portions at a fastening portion fastened to the bottom cover and the printed circuit board.

13 Claims, 22 Drawing Sheets

LIQUID CRYSTAL DISPLAY

This application claims priority to and the benefit of Korea Patent Application NO. 10-2006-0083400 filed on Aug. 31, 2006, which is hereby incorporated by reference for all purposes as if fully set forth herein.

BACKGROUND

1. Field

This document relates to a liquid crystal display.

2. Related Art

A liquid crystal display is a display device which can display an image using an electro-optical characteristic of a liquid crystal.

A liquid crystal display may comprise a liquid crystal panel, a bottom cover, first and second printed circuit boards, and a cover shield. Moreover, the liquid crystal display may further comprise a backlight unit providing light and an inverter substrate providing power to the backlight unit.

The bottom cover is disposed on the back surface of the liquid crystal panel, and can mount and support the liquid crystal panel.

The bottom cover comprises a bottom portion and side portions extending from the bottom portion to thus form a storage space, and this storage space can store the backlight unit.

A plurality of circuit parts generating a driving voltage and/or control signal for driving the liquid crystal panel may be mounted on the first and second printed circuit boards, respectively. Here, the first printed circuit board may be disposed on the lateral surface of the bottom cover by bending a driving film for electrically connecting to the liquid crystal panel. Moreover, the second printed circuit board may be disposed on the back surface of the bottom cover by bending a flexible printed circuit board for electrically connecting to the first printed circuit board.

A cover shield is formed to cover the second printed circuit board, thereby protecting the second printed circuit board. The cover shield may include a body portion and side portions extending from the body portion, and be formed of a metal material.

Meanwhile, FIG. 1 is an exploded perspective view for explaining a back surface fastening structure in a liquid crystal display according to the related art. FIG. 2 is a perspective view showing the back surface in the liquid crystal display of FIG. 1. FIG. 3 is a cross sectional view for explaining the back surface fastening structure in the liquid crystal display in more detail.

Referring to FIGS. 1 to 3, the bottom cover 20, second printed circuit board 40 and cover shield 50 of the liquid crystal display 1 according to the related art may be fastened by the same screws 60.

The bottom cover 20 may have a projecting portion 26 projected in the direction of the second printed circuit board 30 from the bottom portion 22. At this time, burring holes 28 for fastening the screws 60 may be formed in the projecting portion 26.

As the second printed circuit board 40 is disposed between the bottom cover 20 and the cover shield 50, through holes 42 through which the screws 60 pass may be formed in the second printed circuit board 40 corresponding to the position of the burring holes 28.

The cover shield 50 comprises a body portion 52 and side portions 54 extending from the body portion 52 so as to cover the second printed circuit board 40. At this time, though holes 55 through which the screws 60 pass may be formed in the cover shield 50 corresponding to the position of the burring holes 28.

The cover shield 50 may have depressed portions 57 retracted in the direction of the second printed circuit board 40 from the body portion 52. This is for preventing a head portion 62 of the screws 60 from projecting against the body portion 52 when fastening the screws 60.

Meanwhile, screws 60 having a predetermined size are commoditized for the purposes of preventing the screws 60 from being incorporated in the production line of the liquid crystal display 1 that mass-produces liquid crystal displays 1 of various sizes, and of improving the productivity of the liquid crystal display 1.

Accordingly, the depth of the depressed portions 57 of the cover shield 50 needs to be adjusted, and the formation of the depressed portions 57 can be performed by one press process.

However, if the depressed portions 57 are formed by drawing part of the cover shield at a time by using one press process, a crack may be generated in the depressed portions 57. And, the crack generated in the depressed portions 57 may be further deteriorated with the elapse of time.

Due to this, the cover shield 50, second printed circuit board 40, and bottom cover 20 are not precisely fastened, thereby reducing the productivity of the liquid crystal display 1.

SUMMARY

An aspect of this document is to provide a liquid crystal display, comprising: a liquid crystal panel; a bottom cover disposed on the back surface of the liquid crystal panel and mounting and supporting the liquid crystal panel; a printed circuit board disposed on the back surface of the bottom cover; and a cover shield fastened to the bottom cover and the printed circuit board so as to cover the printed circuit board and comprising at least two depressed portions at a fastening portion fastened to the bottom cover and the printed circuit board.

According to the present invention, it is possible to prevent a crack or the like of the cover shield at the fastening portion for fastening screws, as well as to commoditize the screws used to fasten between the bottom cover, printed circuit board and cover shield.

Advantages and features of the present invention and methods of accomplishing the same may be understood more readily with reference to the following detailed description of preferred embodiments and the accompanying drawings.

DETAILED DESCRIPTION

Hereinafter, an implementation of this document will be described in detail with reference to the attached drawings.

Figure 1:
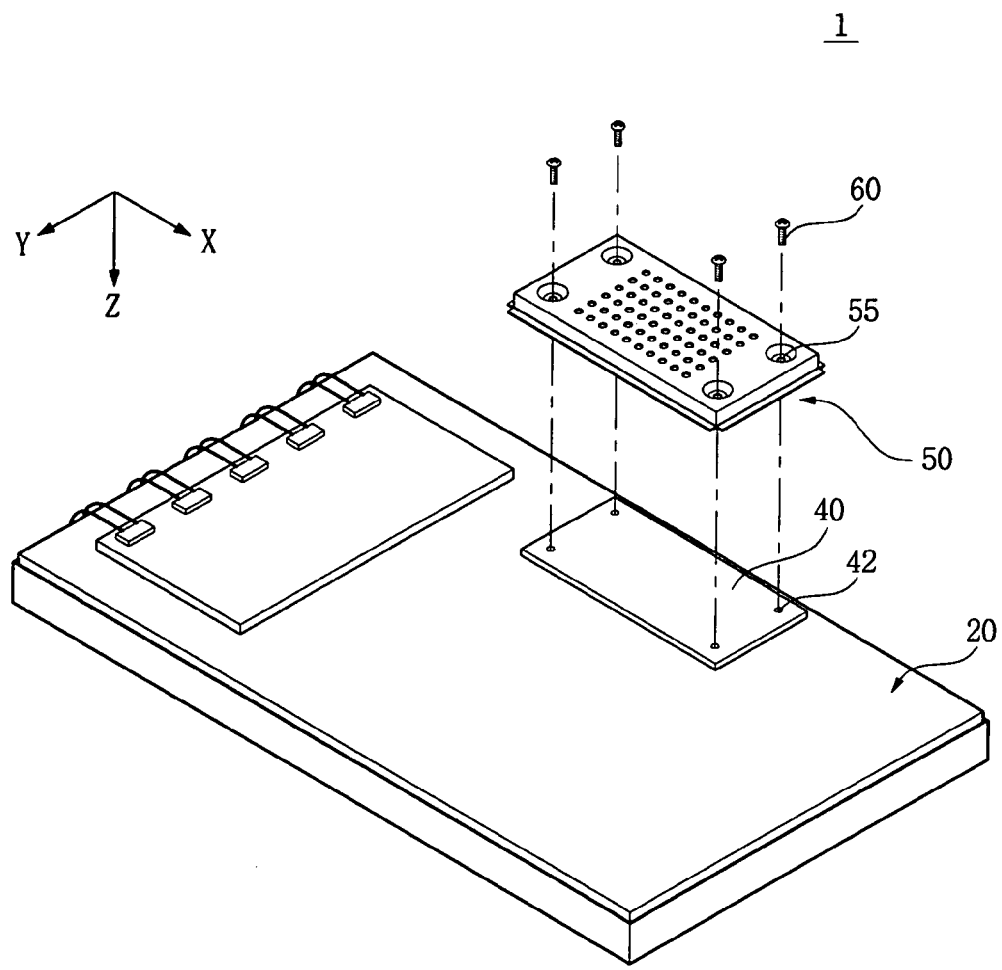
FIG. 1 is an exploded perspective view for explaining a back surface fastening structure in a liquid crystal display according to the related art.
Figure 2:
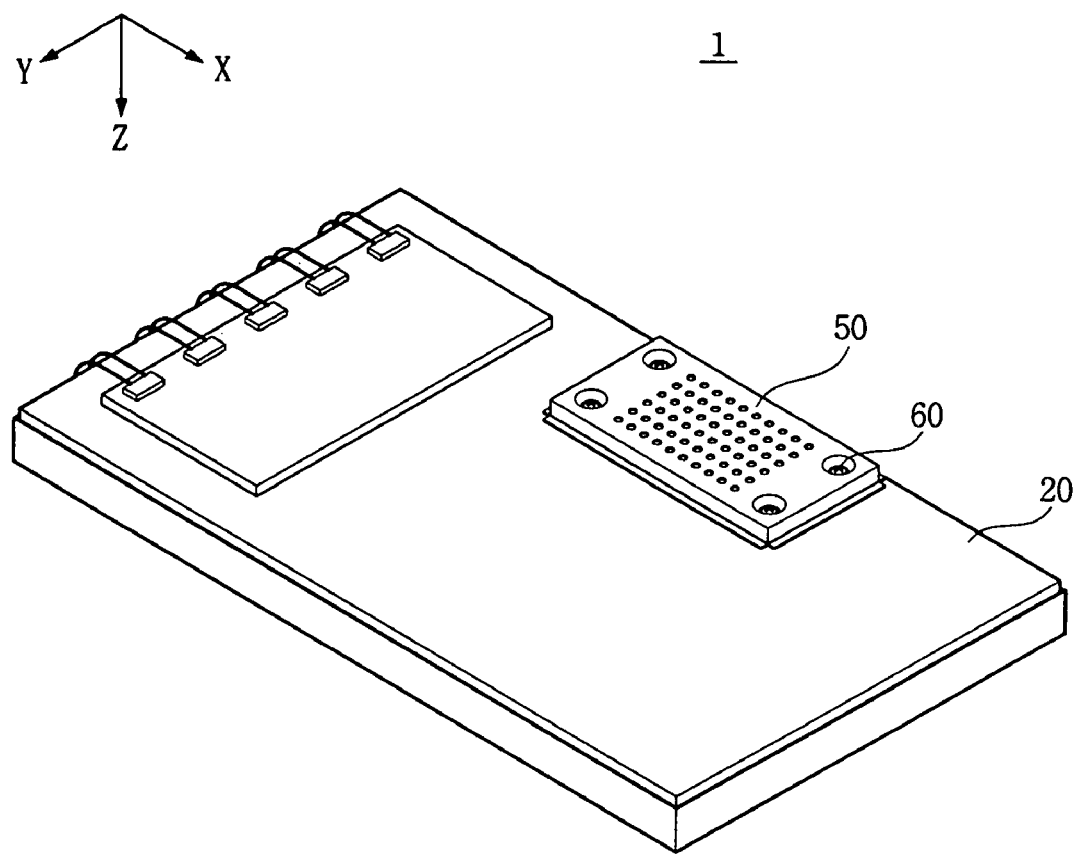
FIG. 2 is a perspective view showing the back surface in the liquid crystal display of FIG. 1.
Figure 3:
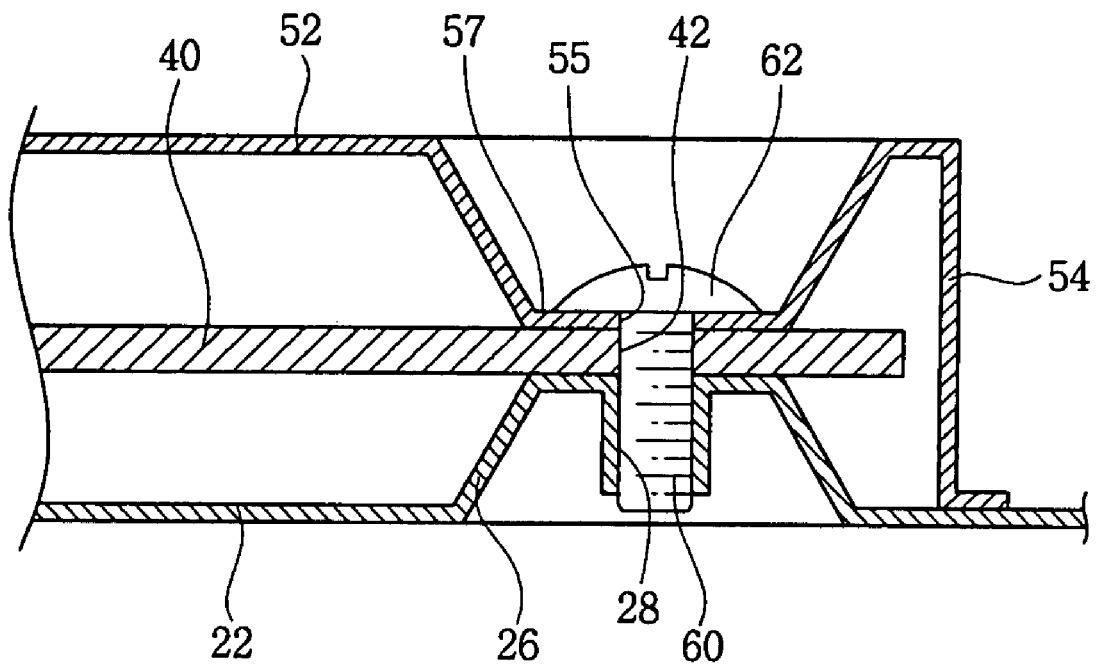
FIG. 3 is a cross sectional view for explaining the back surface fastening structure in the liquid crystal display in more detail.
Figure 4:
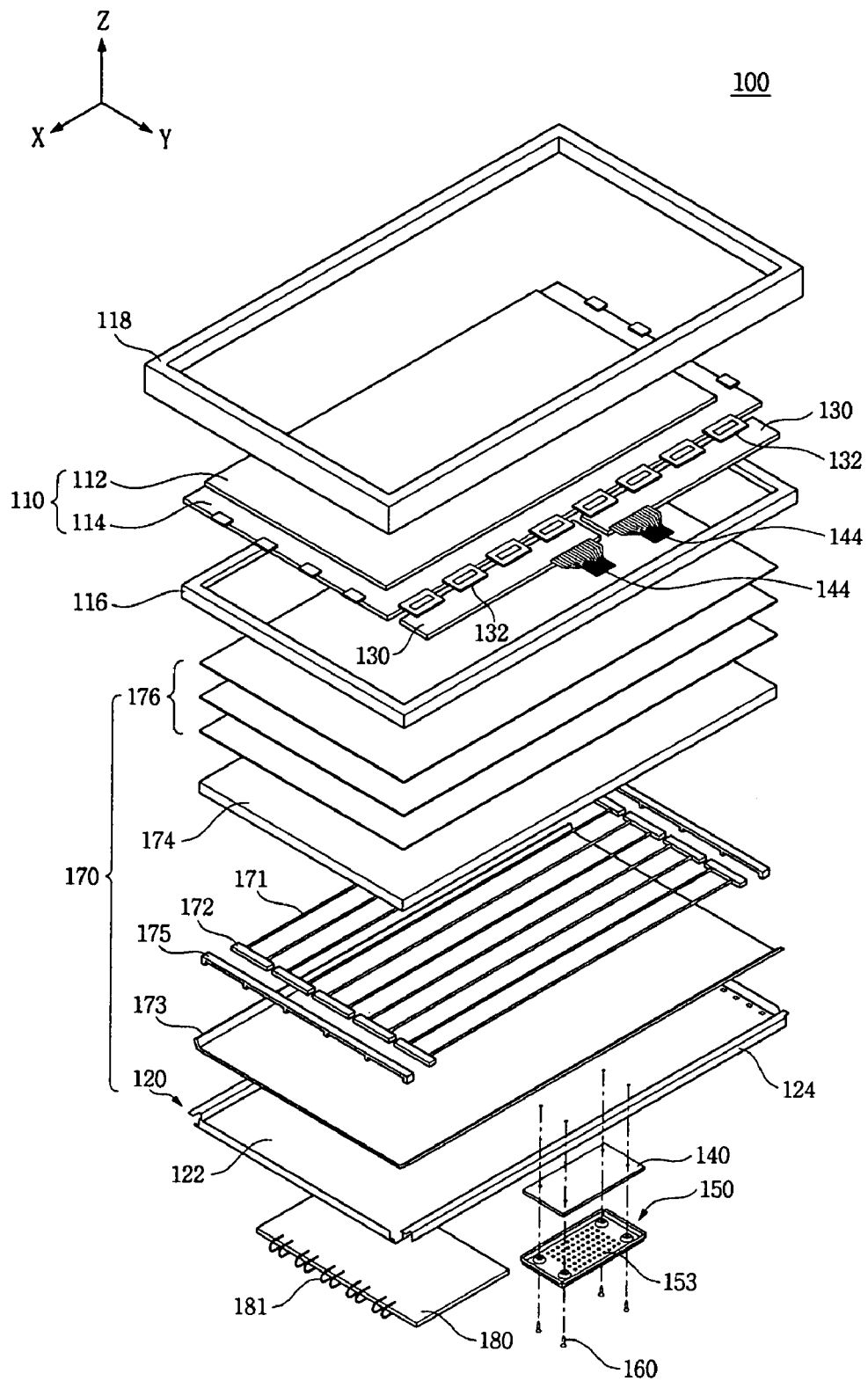
FIG. 4 is an exploded perspective view for explaining a back surface fastening structure in the liquid crystal display of FIG. 4.
Figure 5:
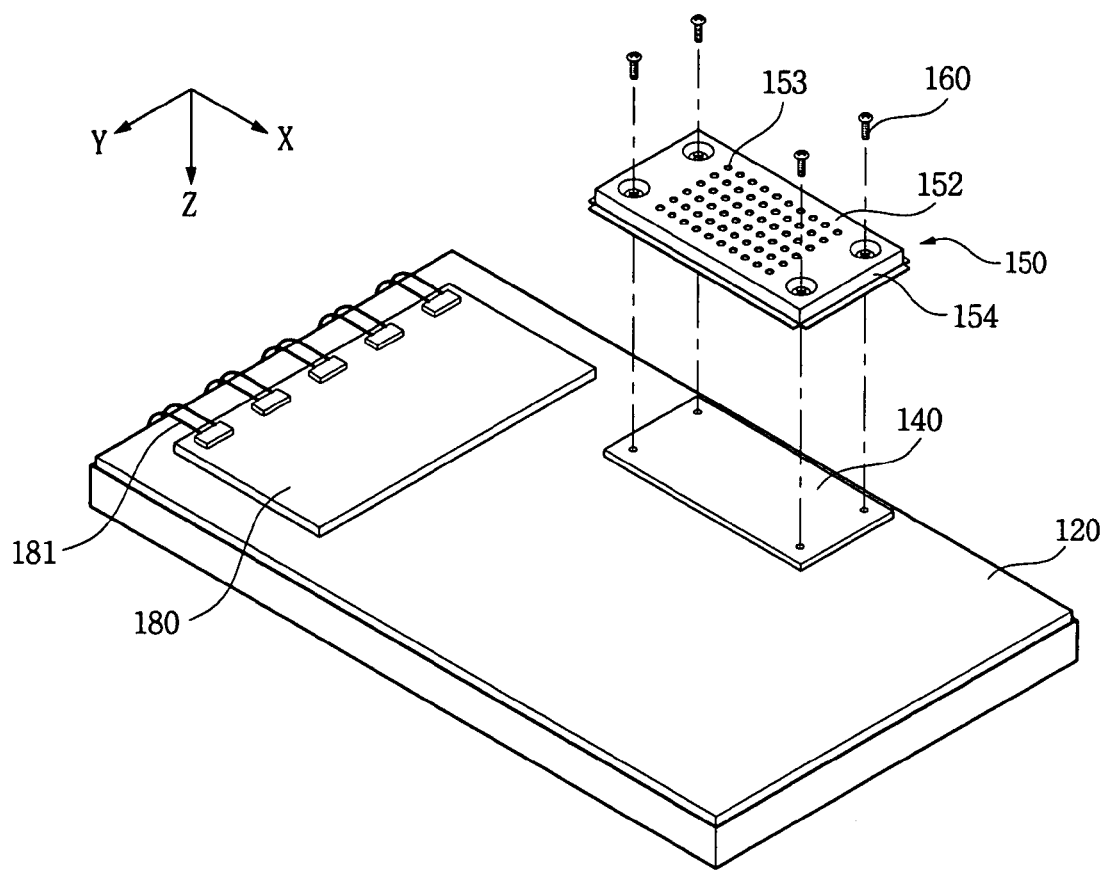
FIG. 5 is an exploded perspective view for explaining a back surface fastening structure in the liquid crystal display of FIG. 4.
Figure 6:
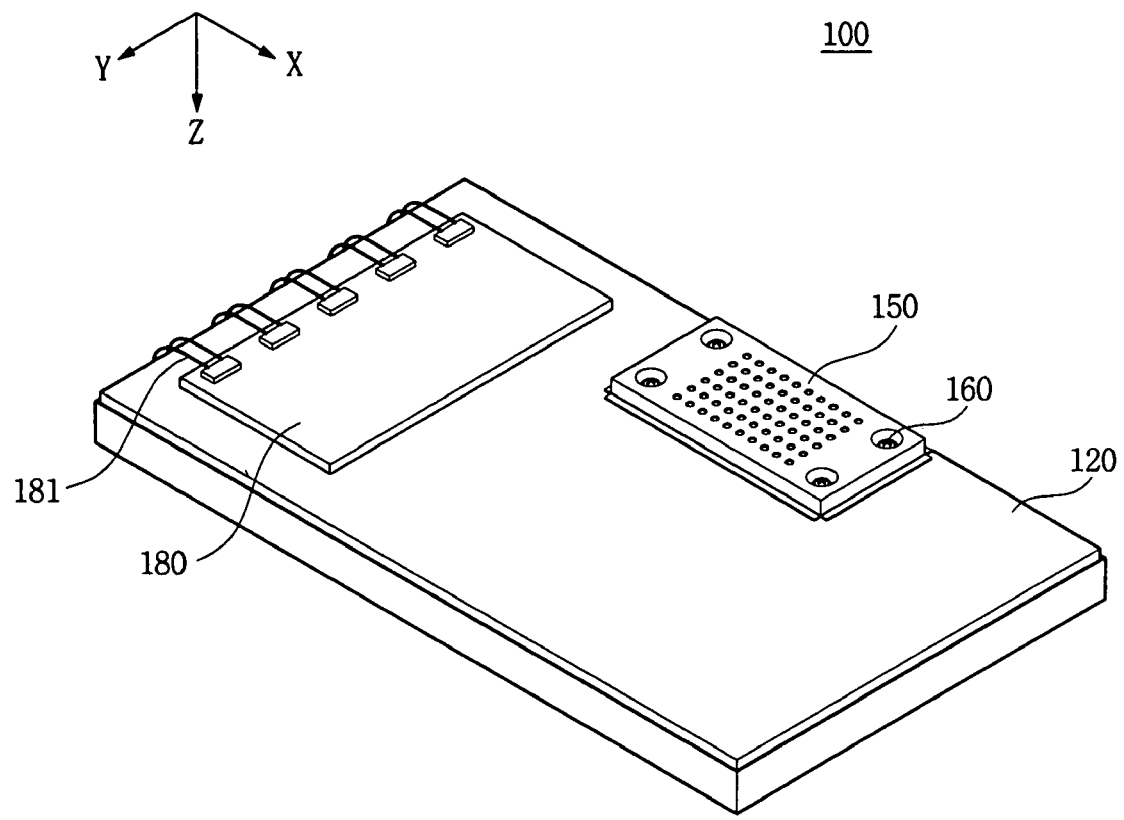
FIG. 6 is a perspective view showing the back surface in the liquid crystal display of FIG. 4.

FIG. 4 is an exploded perspective view for explaining a back surface fastening structure in the liquid crystal display of FIG. 4. FIG. 5 is an exploded perspective view for explaining a back surface fastening structure in the liquid crystal display of FIG. 4. FIG. 6 is a perspective view showing the back surface in the liquid crystal display of FIG. 4.

Referring to FIGS. 4 to 6, the liquid crystal display according to one embodiment of the present invention may comprise a liquid crystal panel 110, a bottom cover 120, first and second printed circuit boards 130 and 140, and a cover shield 150. Further, the liquid crystal display 100 according to one embodiment of the present invention may further comprise a backlight unit 170 providing light and an inverter substrate 180 supplying power to the backlight unit.

The liquid crystal panel 110 may be mounted on a panel guide 116 formed in a roughly rectangular frame so as to cover side portions 124 of the bottom cover 120. At this time, the liquid crystal panel 110 may be fixed onto the panel guide 116 by a top cover 118 which is fastened to the panel guide 116 and the bottom cover 120 through screws and/or hooks.

The liquid crystal panel 110 may comprise a color filter substrate 112 and a thin film transistor substrate 114 that are opposed to each other with a liquid crystal interposed between them.

The color filter substrate 112 represents colors of an image to be displayed through the liquid crystal panel 110. The color filter substrate 112 may comprise a color filter array, for example, red/green/blue filter arrays, formed of a thin film on a substrate of a transparent material such as glass or plastic.

The thin film transistor substrate 114 may provide a driving voltage provided from the first printed circuit board 130 to liquid crystal in response to a control signal provided from the second printed circuit board 140. The thin film transistor substrate 114 may comprise a thin film transistor formed as a thin film on a substrate of a transparent material such as glass or plastic, pixel electrodes, and common electrodes. Here, the common electrodes may be formed on the color filter substrate.

The bottom cover 120 may be disposed on the back surface of the liquid crystal panel 110, and mount and support the liquid crystal panel 110. That is, the bottom cover 120 is disposed on the back surface of the liquid crystal panel 110 to mount and support the liquid crystal panel 110 through the panel guide 116 fastened to the bottom cover 120.

The bottom cover 120 comprises a bottom portion 122 and side portions 124 extending from the bottom portion 122, thereby forming a storage space. In this storage space, a backlight unit 170 disposed between the bottom cover 120 and the liquid crystal panel 110 may be stored.

A plurality of circuit parts for generating a driving voltage and/or control signal for driving the liquid crystal panel 110 may be mounted on the first and second printed circuit boards 130 and 140, respectively. Each of the first and second printed circuit boards 130 and 140 will be described in more detail.

A plurality of circuit parts, for example, a resistor, a capacitor and the like, may be mounted on the first printed circuit board 130. The plurality of circuit parts mounted on the first printed circuit board 130 may generate a driving voltage required for the driving of the liquid crystal panel 110 by using a control signal provided from the second printed circuit board 140. At this time, the generated driving voltage may be provided to the thin film transistor substrate 114 through driving films 132 for electrically connecting the first printed circuit board 130 and the thin film transistor substrate 114.

The size of the first printed circuit board 130 increases along with an increase in the size of the liquid crystal display 100. Due to this, if the first printed circuit board 130 is formed in one unit, it can receive a high tensile force. Thus, the first printed circuit board 130 may be divided into two. The first printed circuit board 130 of this type may be disposed on the lateral surface of the bottom cover 120 by bending the driving films 132.

A plurality of circuit parts, for example, a timing controller or the like, may be mounted on the second printed circuit board 140. The plurality of circuit parts mounted on the second printed circuit board may generate a control signal for driving the liquid crystal panel 110 by realigning a control signal inputted from outside. At this time, the generated control signal may be provided to the first printed circuit board 130 through a flexible printed circuit board 144 connecting the second printed circuit board 140 and the first printed circuit board 130 divided into two. The second printed circuit board 140 of this type may be disposed on the back surface of the bottom cover 120 by bending the flexible printed circuit board 144.

Meanwhile, rather than forming the first and second printed circuit boards 130 and 140, respectively, the first and second printed circuit boards 130 and 140 are formed as one unit, and the printed circuit boards formed as one unit may be disposed on the back surface of the bottom cover 120 by vending the driving films 132. At this time, the flexible printed circuit board 144 may not be required.

The cover shield 150 may protect the second printed circuit board 140 by being formed so as to cover the second printed circuit boar 140. Further, the cover shield 150 may prevent the movement of the second printed circuit boar 140 by fastening the bottom cover 120 and the second printed circuit board 140 by the screws 160.

The cover shield 150 may comprise a body portion 152 and side portions 154 extending from the body portion 152, and may be formed of a metal material with high rigidity. Here, a plurality of radiation holes 153 may be formed in the body portion 152 of the cover shield 150, for emitting the heat emitted from the plurality of circuit parts mounted on the second printed circuit board 140.

The backlight unit 170 comprises a light source 171, a reflective plate 173, a diffusion plate 174, and an optical sheet 176.

The light source 171 may generate light by being driven by a boosted AC voltage provided from the inverter substrate 180. The light source 171 may be fixed by being inserted into light source holders 172 formed at both opposite ends thereof.

Such a light source 171 may be any one of a cold cathode fluorescent lamp (CCFL), a hot cathode fluorescent lamp (HCFL) and an external electrode fluorescent lamp (EEFL), but is not limited thereto.

The reflective plate 173 may increase light efficiency by reflecting upward the light exiting downward among the light exiting in all directions (upward/downward/leftward/rightward) from the light source 171.

The diffusion plate 174 may be mounted on a support side mold 175 and/or bottom cover 120. The diffusion plate 174 prevents the shape of the light source 171 from being shown on the liquid crystal panel 110, and may diffuse the light emitted from the light source 171.

The optical sheet 176 may be mounted on the diffusion plate 174. The optical sheet 176 may improve the brightness characteristic of the light exiting from the light source 171.

The optical sheet 176 may comprise at least one of a diffusion sheet, a prism sheet, and a brightness enhancement sheet.

The inverter substrate 180 may be disposed on the back surface of the bottom cover 120. A plurality of circuit parts for driving the light source 171 may be mounted on the inverter substrate 180, which is a kind of printed circuit board. The plurality of circuit parts mounted on the inverter substrate 180 may boost a low AC voltage provided from outside to a high AC voltage for driving the light source 171. At this time, the boosted high AC voltage may be provided to light source electrodes formed at both opposite ends of the light source 171 through a light source electrode line 181.

Such an inverter substrate 180 may be fastened to the bottom cover through screws. Further, the inverter substrate 180 may be protected through a cover shield made of plastic material provided separately.

Figure 7:
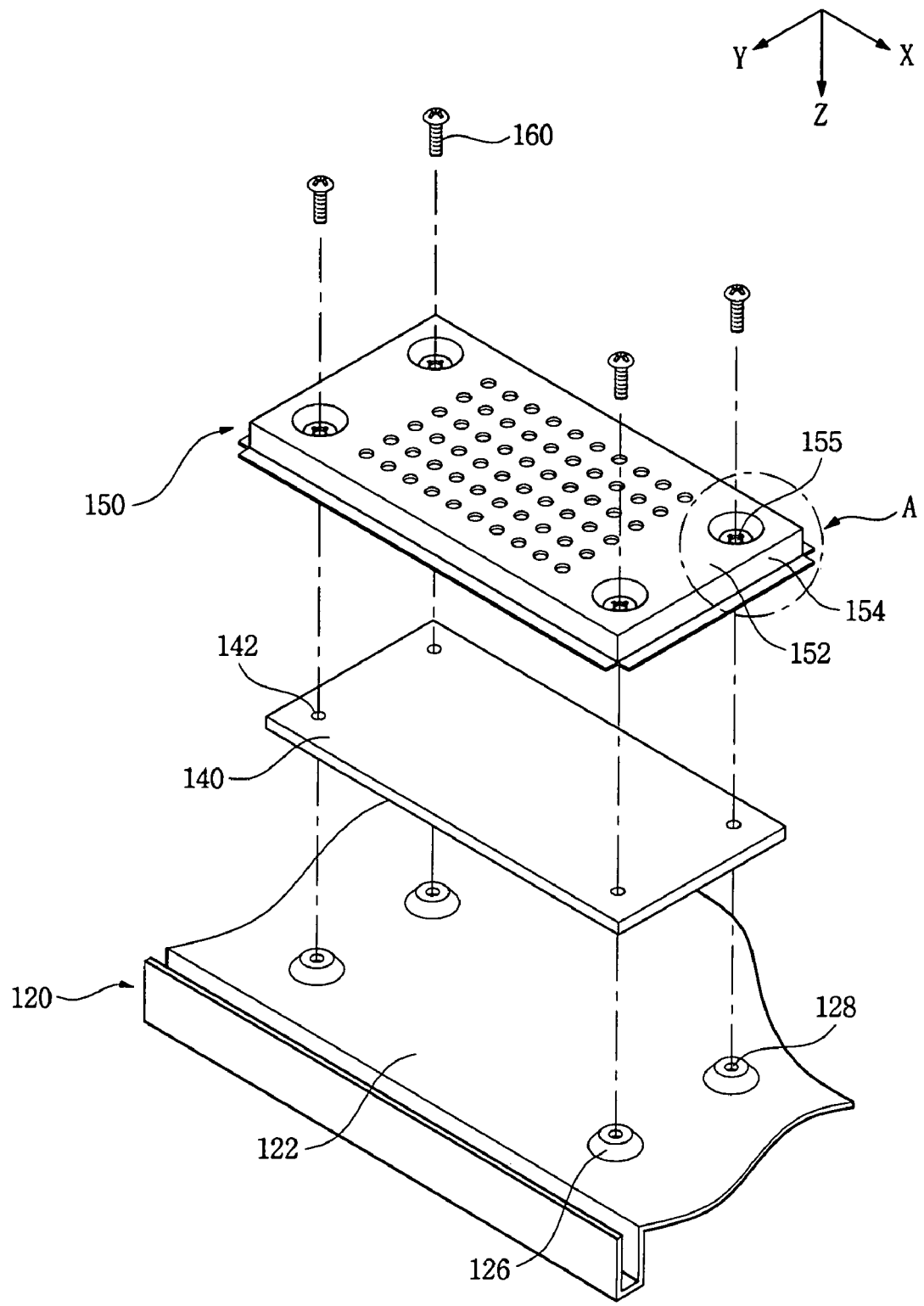
FIG. 7 is a partial exploded perspective view for explaining one example of a back surface fastening structure in the liquid crystal display of FIG. 4 in more detail.
Figure 8:
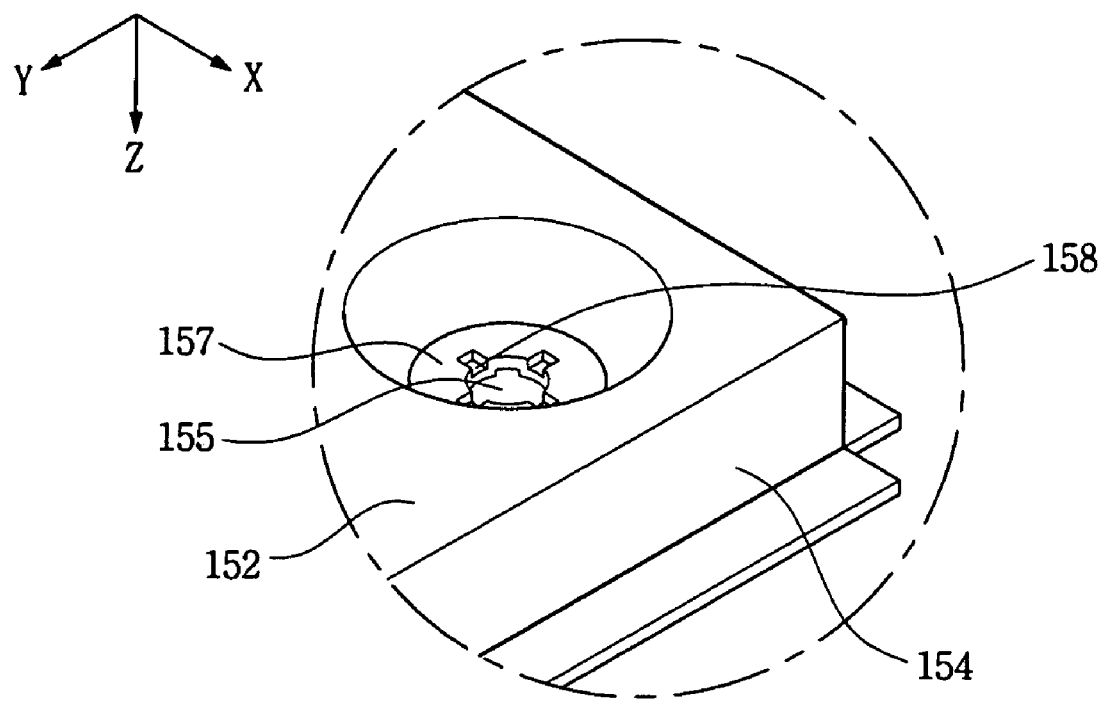
FIG. 8 is a perspective view enlarging "A" of FIG. 7.
Figure 9:
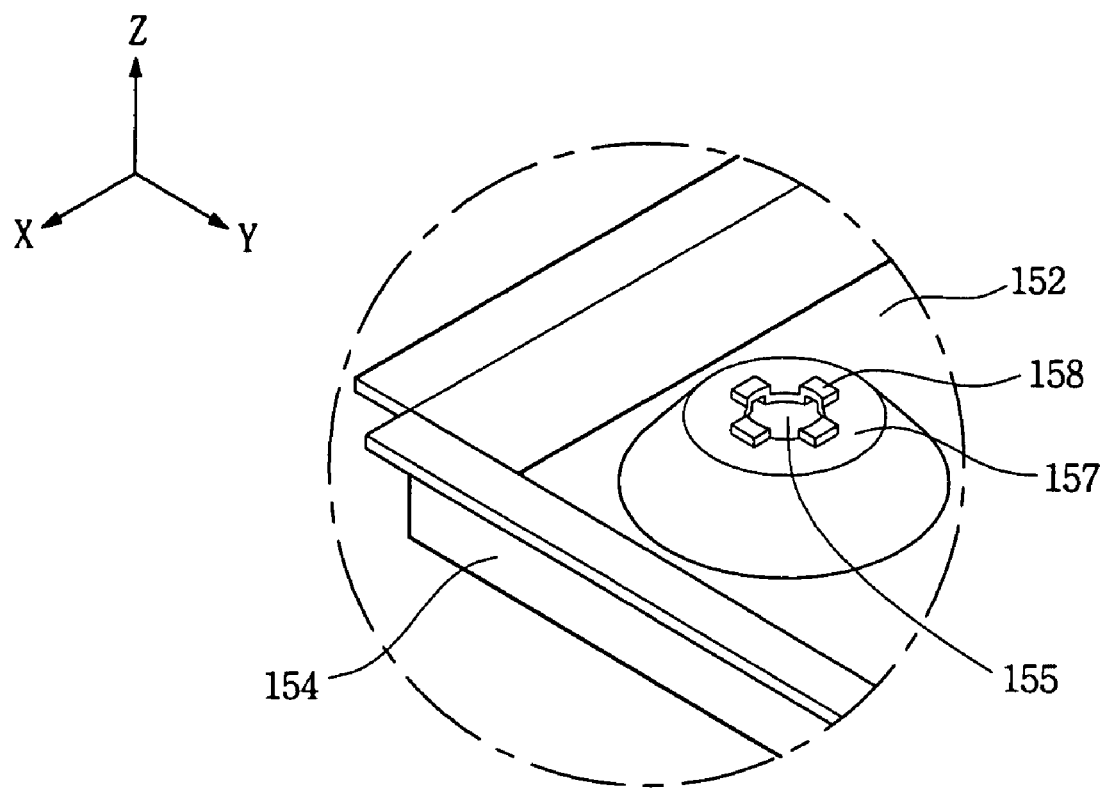
FIG. 9 is a perspective view enlarging "A" of FIG. 7 and showing the front surface thereof.
Figure 10:
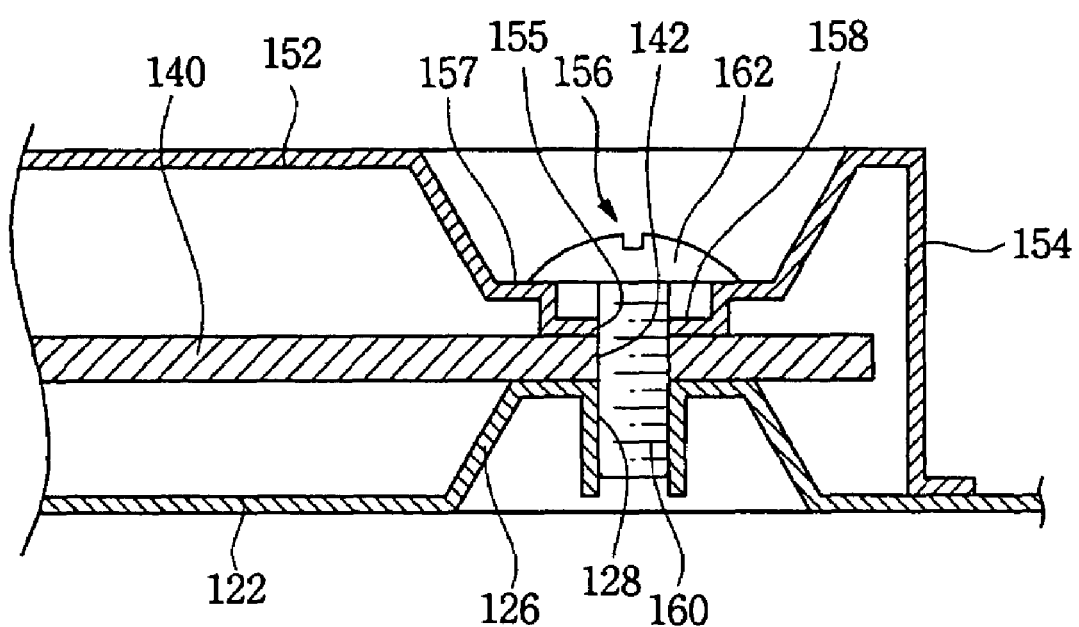
FIG. 10 is a cross sectional view for explaining the fastening structure of FIG. 7 in more detail.

FIG. 7 is a partial exploded perspective view for explaining one example of a back surface fastening structure in the liquid crystal display of FIG. 4 in more detail. FIG. 8 is a perspective view enlarging "A" of FIG. 7. FIG. 9 is a perspective view enlarging "A" of FIG. 7 and showing the front surface thereof.

Referring to FIGS. 7 to 10, a bottom cover 120, a second printed circuit board 140 and a cover shield 150 of the liquid crystal display 100 according to one embodiment of the present invention may be fastened by same screws 160.

The bottom cover 120 may have a projecting portion 126 projected in the direction of the second printed circuit board 140 from the bottom portion 122. At this time, burring holes 28 for fastening the screw 60 may be formed in the projecting portion 26.

As the second printed circuit board 140 is disposed between the bottom cover 120 and the cover shield 150, through holes 142 through which the screws 160 pass may be formed in the second printed circuit board 140 corresponding to the position of the burring holes 128.

The cover shield 150 comprises a body portion 152 and side portions 154 extending from the body portion 152 so as to cover the second printed circuit board 140. At this time, though holes 155 through which the screws 60 pass may be formed in the cover shield 150 corresponding to the position of the burring holes 128.

In the cover shield 150, at least two depressed portions may be formed at a fastening portion 156 fastened to the bottom cover 120 and the printed circuit board 140 in order to commoditize the screws 160 and prevent a crack.

For example, a first depressed portion 157 may be formed which is retracted in the direction of the printed circuit board 140 from the body portion 152. Further, a second depressed portion 158 may be formed which extends from the first depressed portion 157 and is retracted in the direction of the second printed circuit board 140 from the first depressed portion 157.

The first depressed portion 157 may be contacted with head portions 162 of the screws 160, and the second depressed portion 158 may be contacted with the printed circuit board 140. Here, the head portions 162 of the screws 160 may not be projected outward from the body portion 152 by the first depressed portion 157.

The first and second depressed portions 157 and 158 may be formed by first and second press processes of the cover shield 150 formed of metal material, respectively.

Once the first and second depressed portions 157 and 158 are formed respectively by gradually drawing part of the cover shield in a stepwise fashion by the first and second press processes, respectively, it is possible to prevent a crack from being generated in the first and second depressed portions 157 and 158.

The second depressed portion 158 formed by the second press process may be divided into at least two. This is for preventing a crack from being generated in the second depressed portion 158 by preventing the second depressed portion 158 from being drawn much at the time of formation of the second depressed portion 158 by the second press process.

Concretely, part of the cover shield is drawn at a predetermined ratio by a first press process to form a first depressed portion 157. At this time, as the cover shield portion where the first depressed portion 157 is formed has been drawn at a predetermined ratio, if a second depressed portion 158 is formed in an integral closed curve by a second press process, the second depressed portion 158 is drawn once again, which may generate a crack in the second depressed portion 158.

Due to this, the second depressed portion 158 may be formed in at least two divided from each other by locally drawing the second depressed portion 158, rather than forming the second depressed portion 158 in an integral shape by the second press process.

In the cover shield 150, the first depth from the body portion 152 to the first depressed portion 157 may be greater than the second depth from the first depressed portion 157 to the second depressed portion 158. This is for precisely fastening the screws 160 by adjusting the second depth after the height of the screws 160 by the first depth. Here, the screws 160 may be commoditized by properly adjusting the second depth depending on the size of the liquid crystal display 100.

Figure 11:
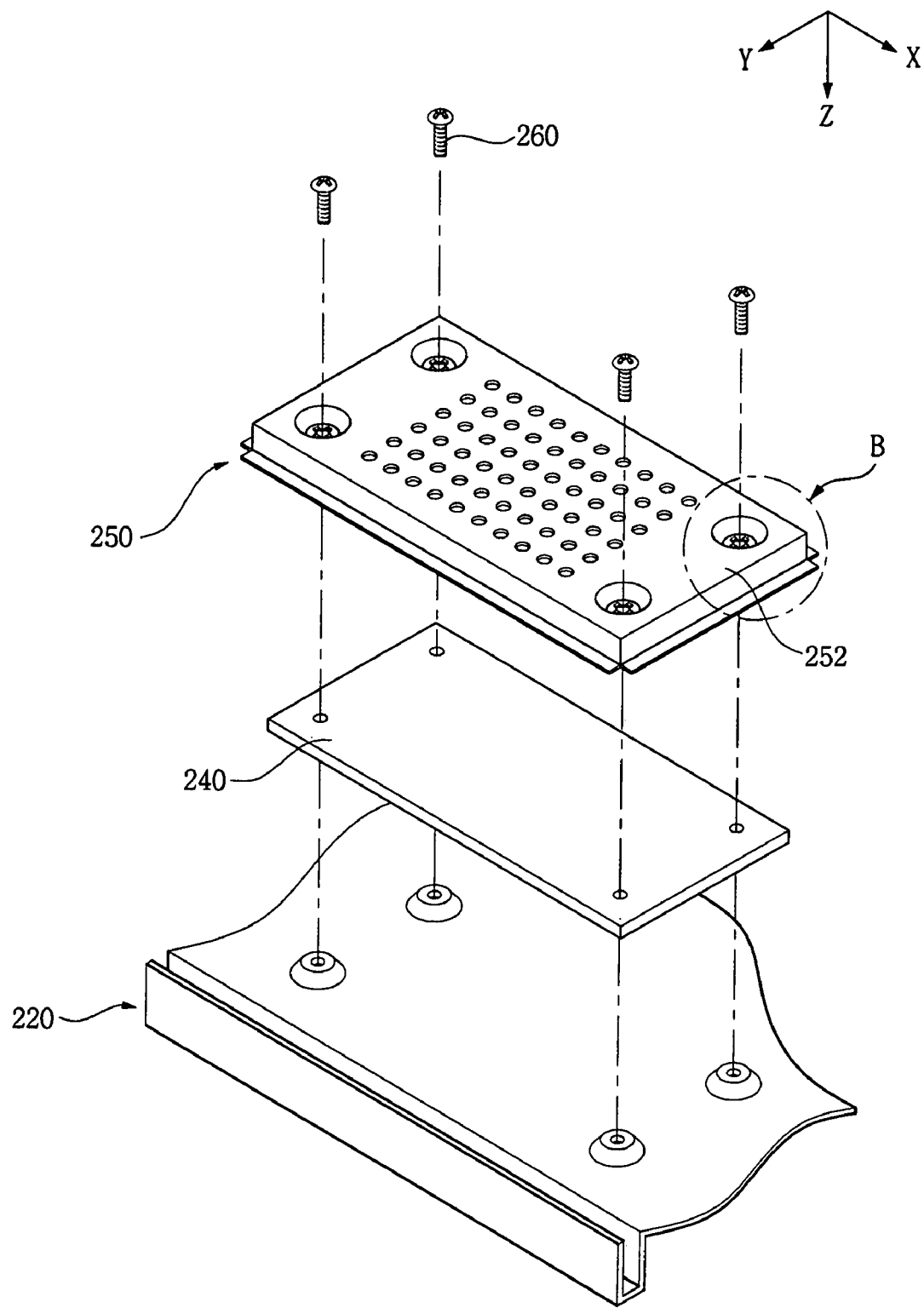
FIG. 11 is a partial exploded perspective view for explaining one example of a back surface fastening structure in detail in the liquid crystal display of FIG. 4.
Figure 12:
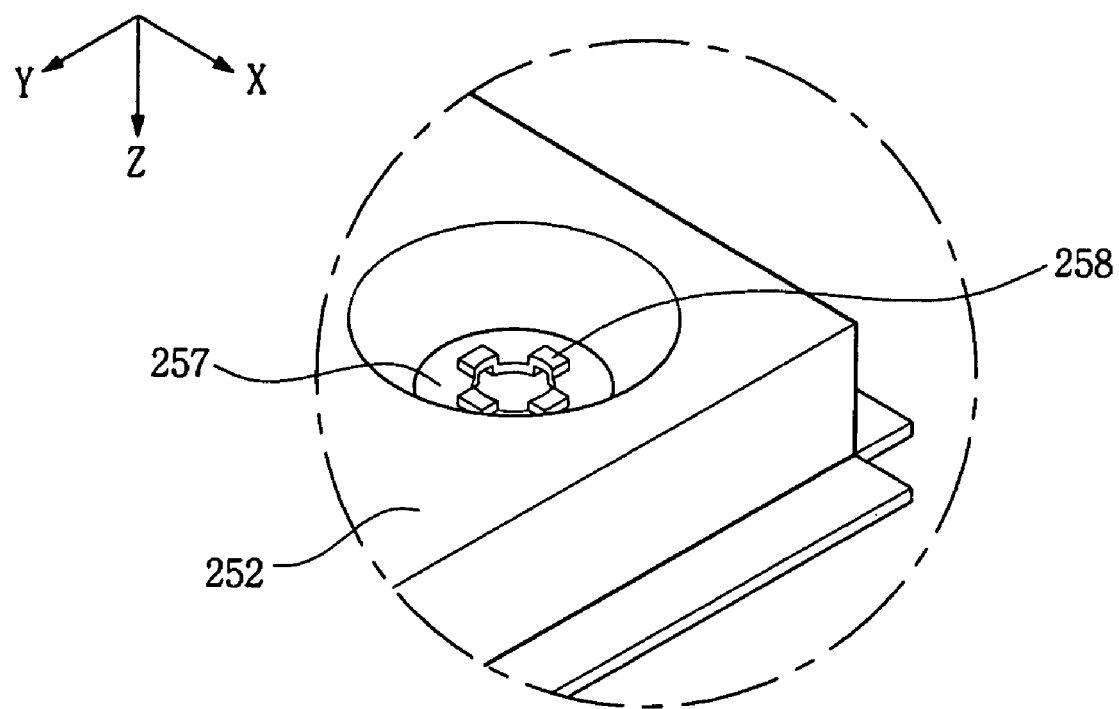
FIG. 12 is a perspective view enlarging "B" of FIG. 11.
Figure 13:
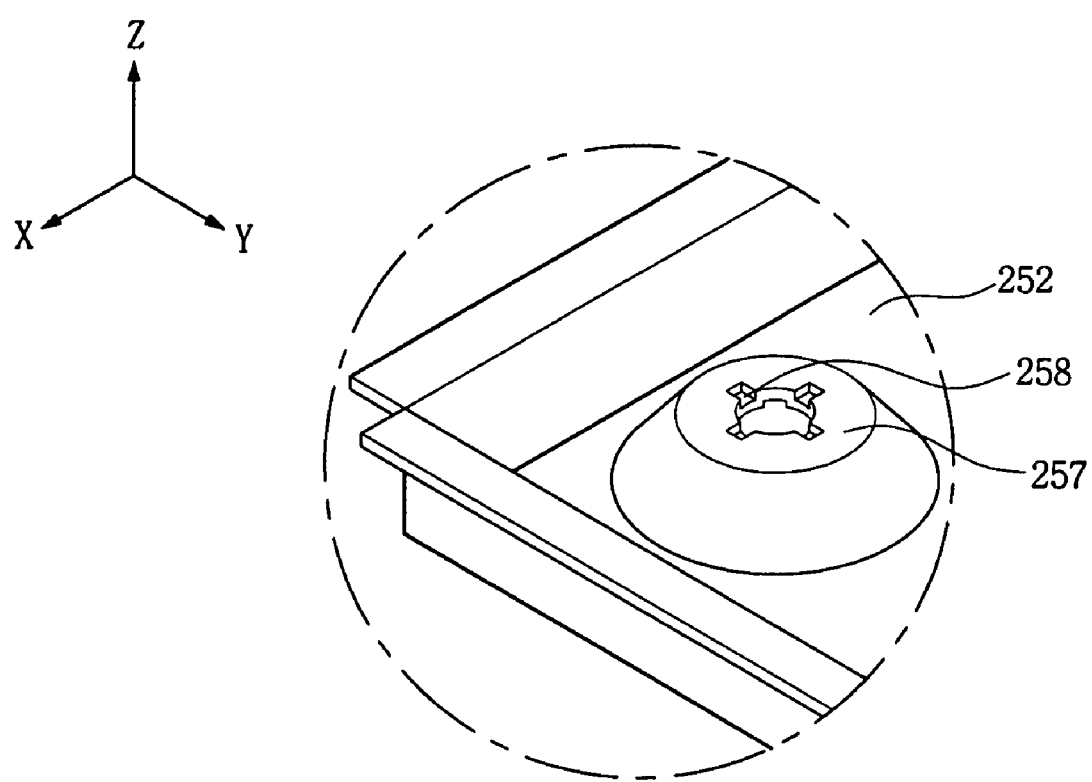
FIG. 13 is a perspective view enlarging "B" of FIG. 11 and showing the front surface thereof.
Figure 14:
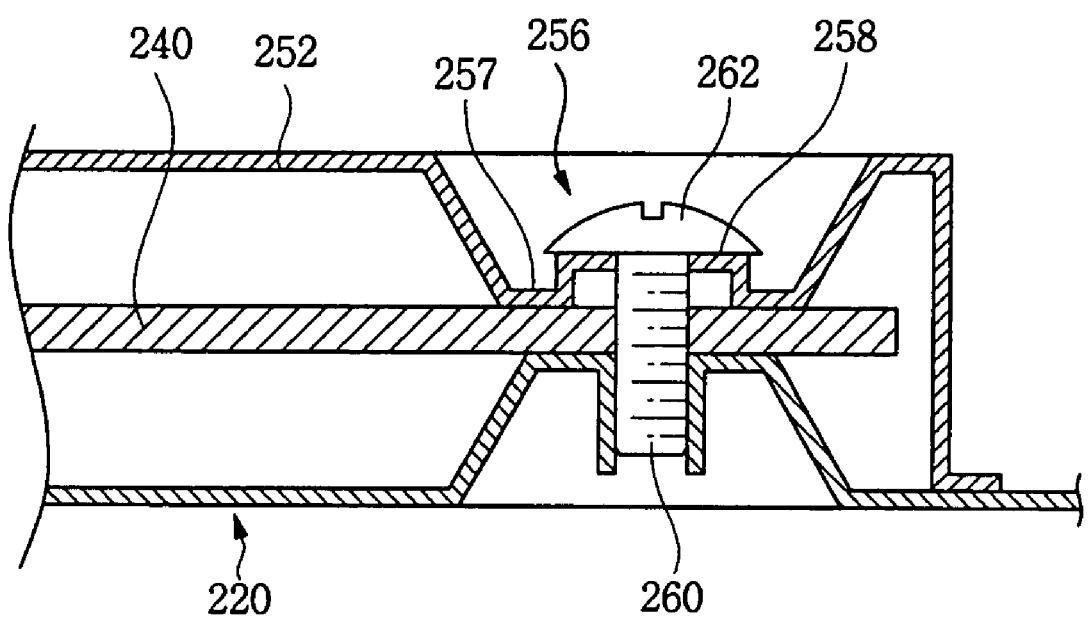
FIG. 14 is a cross sectional view for explaining the second fastening structure of FIG. 11 in more detail.

FIG. 11 is a partial exploded perspective view for explaining one example of a back surface fastening structure in detail in the liquid crystal display of FIG. 4. FIG. 12 is a perspective view enlarging "B" of FIG. 11. FIG. 13 is a perspective view enlarging "B" of FIG. 11 and showing the front surface thereof. FIG. 14 is a cross sectional view for explaining the second fastening structure of FIG. 11 in more detail. The fastening structure as shown in FIGS. 11 to 14 is identical to the fastening structure as shown in FIGS. 7 to 10 except for the formation direction of the second depressed portion of the cover shield, so only the features thereof will be described.

Referring to FIGS. 11 to 14, in a back surface fastening structure of the liquid crystal display according to one embodiment of the present invention, a bottom cover 220, a second printed circuit board 240, and a cover shield 250 may be fastened by same screws 260.

In the cover shield 250, at least two depressed portions may be formed at a fastening portion 256 fastened to the bottom cover 220 and the printed circuit board 240 in order to commoditize the screws and prevent a crack.

For example, in the cover shield 250, a first depressed portion 257 may be formed which is retracted in the direction of the second printed circuit board 240 from the body portion 252 of the cover shield 250. Further, a second depressed portion 258 may be formed which extends from the first depressed portion 257 and is retracted in the direction of the body portion 252 from the first depressed portion 257. At this time, the first depth from the body portion 252 to the first depressed portion 257 in the cover shield 250 may be greater than the second depth between the first and second depressed portions 257 and 258.

Due to this, the first depressed portion 257 may be contacted with the second printed circuit board 240, and the second depressed portion 258 may be contacted with head portions 262 of the screws 260. Here, the head portions 262 of the screws 260 may not be projected against the body portion 252 by the first depressed portion 257.

The first and second depressed portions 257 and 258 may be formed by first and second press processes, respectively, of the cover shield 250 formed of a metal material.

Figure 15:
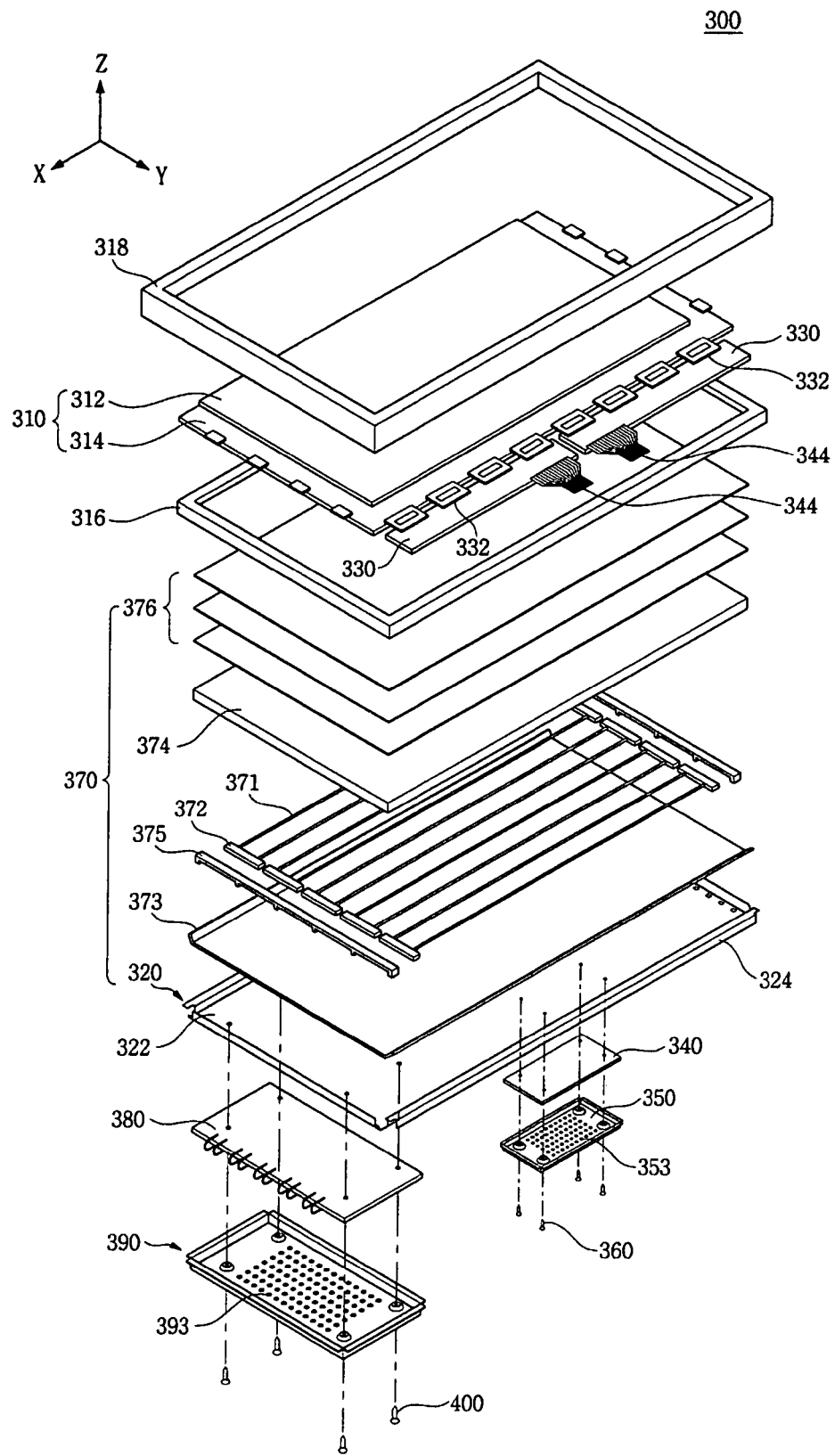
FIG. 15 is an exploded perspective view showing a liquid crystal display according to one embodiment of the present invention.
Figure 16:
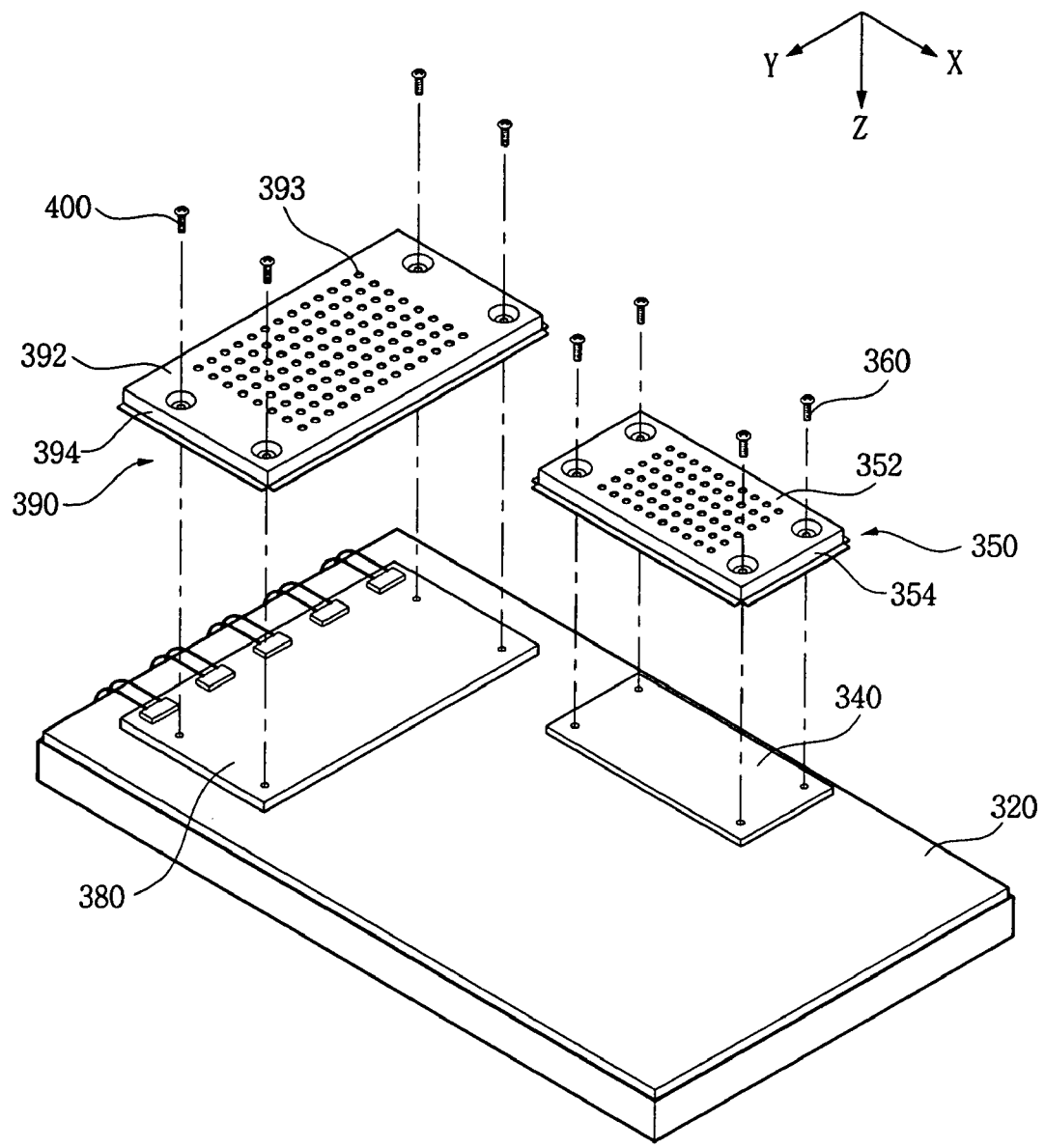
FIG. 16 is an exploded perspective view for explaining a back surface fastening structure in the liquid crystal display of FIG. 15.
Figure 17:
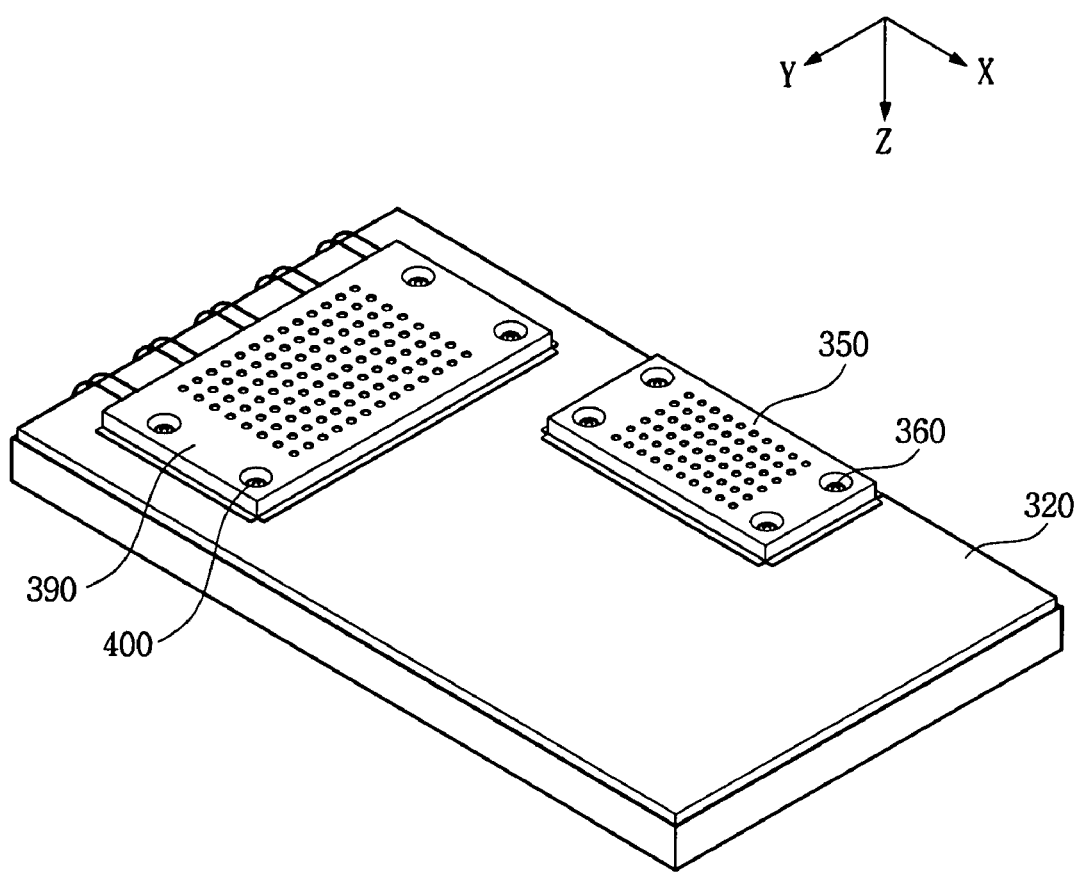
FIG. 17 is a perspective view showing the back surface in the liquid crystal display of FIG. 15.

Meanwhile, FIG. 15 is an exploded perspective view showing a liquid crystal display according to one embodiment of the present invention. FIG. 16 is an exploded perspective view for explaining a back surface fastening structure in the liquid crystal display of FIG. 15. FIG. 17 is a perspective view showing the back surface in the liquid crystal display of FIG. 15. The liquid crystal display as shown in FIG. 15 is similar to the liquid crystal display as shown in FIG. 4, so only the features thereof will be described.

Referring to FIGS. 15 to 17, the liquid crystal display 300 according to one embodiment of the present invention may comprise a liquid crystal panel 310, a backlight unit 370, a bottom cover 320, an inverter substrate 380, and a first cover shield 390. Further, the liquid crystal display 300 according to one embodiment of the present invention may further comprise first and second printed circuit boards 330 and 340 and a second cover shield 350.

The inverter substrate 380 may be disposed on the back surface of the bottom cover 320. A plurality of circuit parts for driving a light source 271 may be mounted on the inverter substrate 380, which is a kind of printed circuit board.

The first cover shield 390 may protect the inverter substrate 380 by being formed so as to cover the inverter substrate 380. Further, the first cover shield 390 may prevent the movement of the inverter substrate 380 by fastening the bottom cover 320 and the inverter substrate 380 by screws 400.

The first cover shield 390 may comprise a body portion 392 and side portions 394 extending from the body portion 392, and may be formed of a metal material with high rigidity. Here, a plurality of radiation holes 393 may be formed in the body portion 392 of the first cover shield 390, for emitting the heat emitted from the plurality of circuit parts mounted on the inverter substrate 380.

A plurality of circuit parts for generating a driving voltage and/or control signal for driving the liquid crystal panel 310 may be mounted on the first and second printed circuit boards 330 and 340, respectively.

The second cover shield 350 may protect the second printed circuit board 340 by being formed so as to cover the second printed circuit boar 340. Further, the second cover shield 350 may prevent the movement of the second printed circuit boar 340 by fastening the bottom cover 320 and the second printed circuit board 340 by screws 360.

In the liquid crystal display according to one embodiment of the present invention, unexplained reference numerals 312 and 314 represent a color filter substrate and a thin film transistor substrate, respectively. Further, unexplained reference numerals 316 and 318 represent a panel guide and a top cover, respectively. Further, unexplained reference numerals 322 and 324 represent a bottom portion and side portions of the bottom cover, respectively. Further, unexplained reference numerals 332 and 344 represent a driving film and a flexible printed circuit board, respectively. Further, unexplained reference numerals 352, 353, and 354 represent a body portion, radiation holes and side portions of the second cover shield, respectively. Further, unexplained reference numerals 372, 373, 374, 375, and 376 represent a light source holder, a reflective plate, a diffusion plate, a support side mold, and an optical sheet, respectively. Further, unexplained reference numeral 393 represents radiation holes of the first cover shield.

Figure 18:
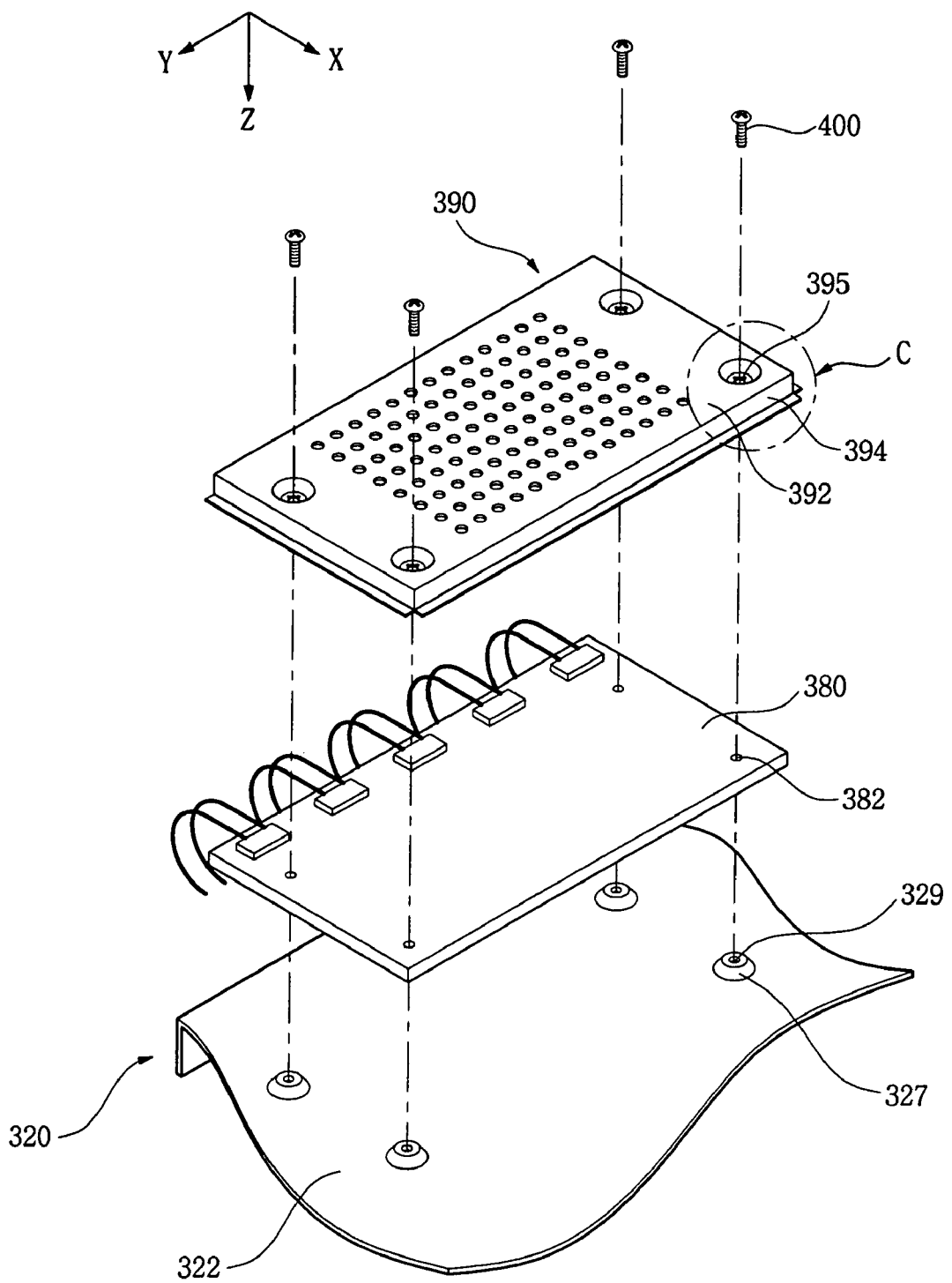
FIG. 18 is a partial exploded perspective view for explaining one example of a back surface fastening structure in detail in the liquid crystal display of FIG. 15.
Figure 19:
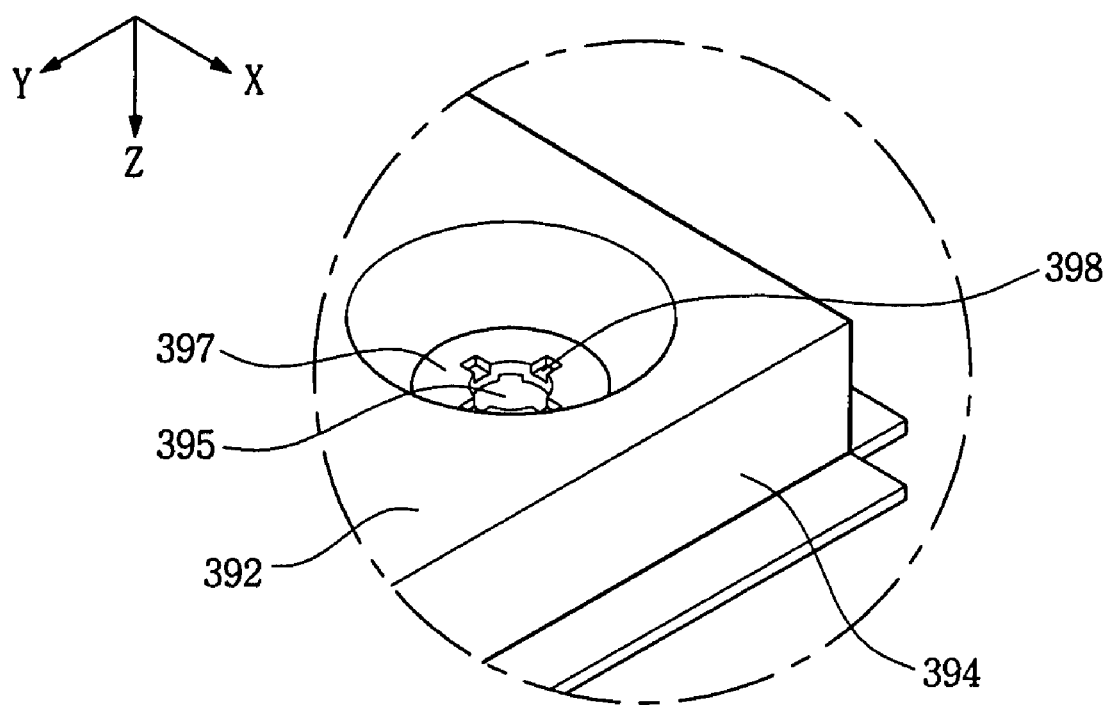
FIG. 19 is a perspective view enlarging "C" of FIG. 18.
Figure 20:
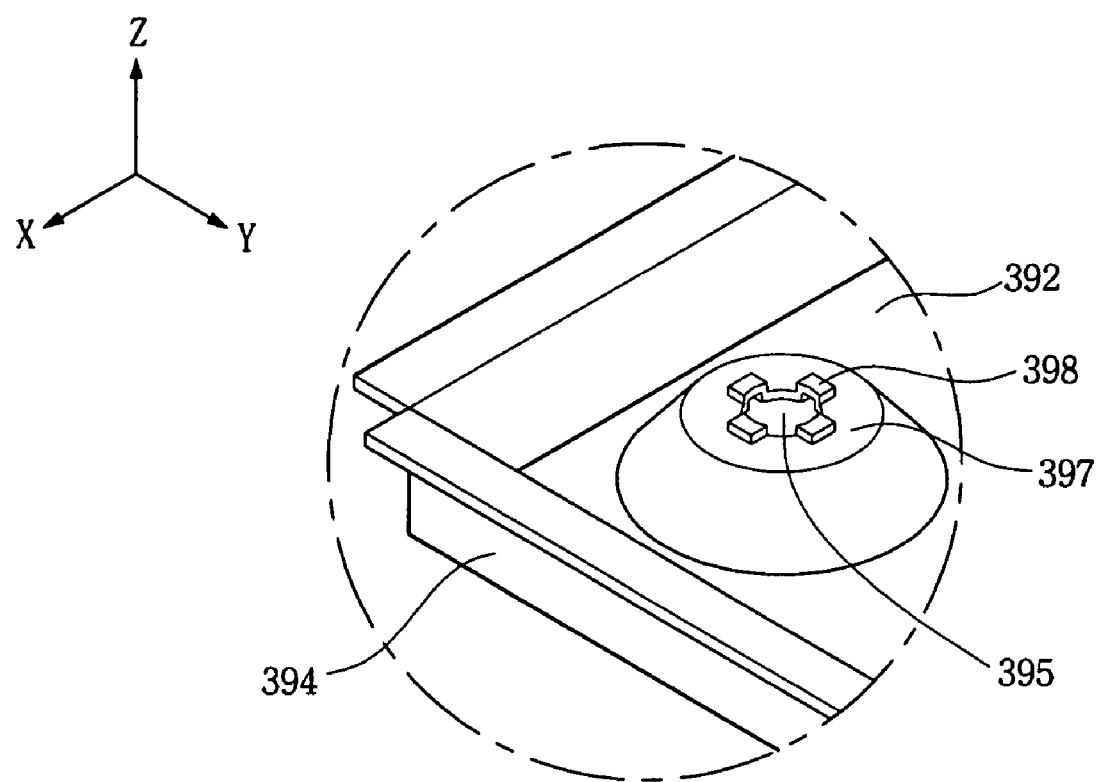
FIG. 20 is a perspective view enlarging "C" of FIG. 18 and showing the front surface thereof.
Figure 21:
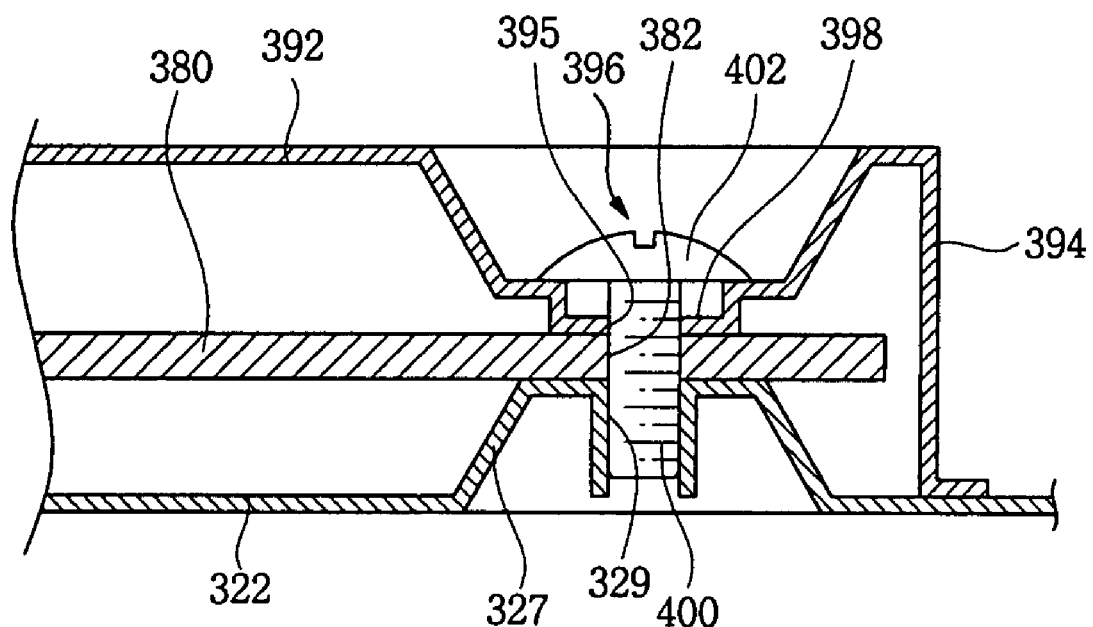
FIG. 21 is a cross sectional view for explaining the fastening structure of FIG. 18 in more detail.

FIG. 18 is a partial exploded perspective view for explaining one example of a back surface fastening structure in detail in the liquid crystal display of FIG. 15. FIG. 19 is a perspective view enlarging "C" of FIG. 18. FIG. 20 is a perspective view enlarging "C" of FIG. 18 and showing the front surface thereof. FIG. 21 is a cross sectional view for explaining the fastening structure of FIG. 18 in more detail.

Referring to FIGS. 18 to 21, in a back surface fastening structure of the liquid crystal display 300 according to one embodiment of the present invention, a bottom cover 320, an inverter substrate 380, and a first cover shield 390 may be fastened by same screws 400.

The bottom cover 320 may have a projecting portion 327 projected in the direction of the inverter substrate 380 from the bottom portion 322. At this time, burring holes 382 for fastening the screw 400 may be formed in the projecting portion 327.

As the inverter substrate 380 is disposed between the bottom cover 320 and the first cover shield 390, through holes 382 through which the screws 400 pass may be formed in the inverter substrate 380 corresponding to the position of the burring holes 329.

The first cover shield 390 comprises a body portion 392 and side portions 394 extending from the body portion 392 so as to cover the inverter substrate 380. At this time, though holes 395 through which the screws 400 pass may be formed in the first cover shield 390 corresponding to the position of the burring holes 329.

In the first cover shield 390, at least two depressed portions may be formed at a first fastening portion 396 fastened to the bottom cover 320 and the inverter substrate 380 in order to commoditize the screws 400 and prevent a crack.

For example, in the first cover shield 390, a first depressed portion 397 may be formed which is retracted in the direction of the inverter substrate 380 from the body portion 392 of the first cover shield 390. Further, a second depressed portion 398 may be formed which extends from the first depressed portion 397 and is retracted in the direction of the inverter substrate 380 from the first depressed portion 397. At this time, the first depth from the body portion 392 to the first depressed portion 397 in the first cover shield 390 may be greater than the second depth between the first and second depressed portions 397 and 398. Here, the screws 400 may be commoditized by properly adjusting the second depth between the first and second depressed portions 397 and 398 depending on the size of the liquid crystal display 300.

Due to this, the first depressed portion 397 may be contacted with head portions 402 of the screws 400, and the second depressed portion 398 may be contacted with the inverter substrate 380. Here, the head portions 402 of the screws 400 may not be projected outward from the body portion 392 by the first depressed portion 397.

The first and second depressed portions 397 and 398 may be formed by first and second press processes of the first cover shield 390 formed of metal material, respectively.

The second depressed portion 398 formed by the second press process may be divided into at least two.

Figure 22:
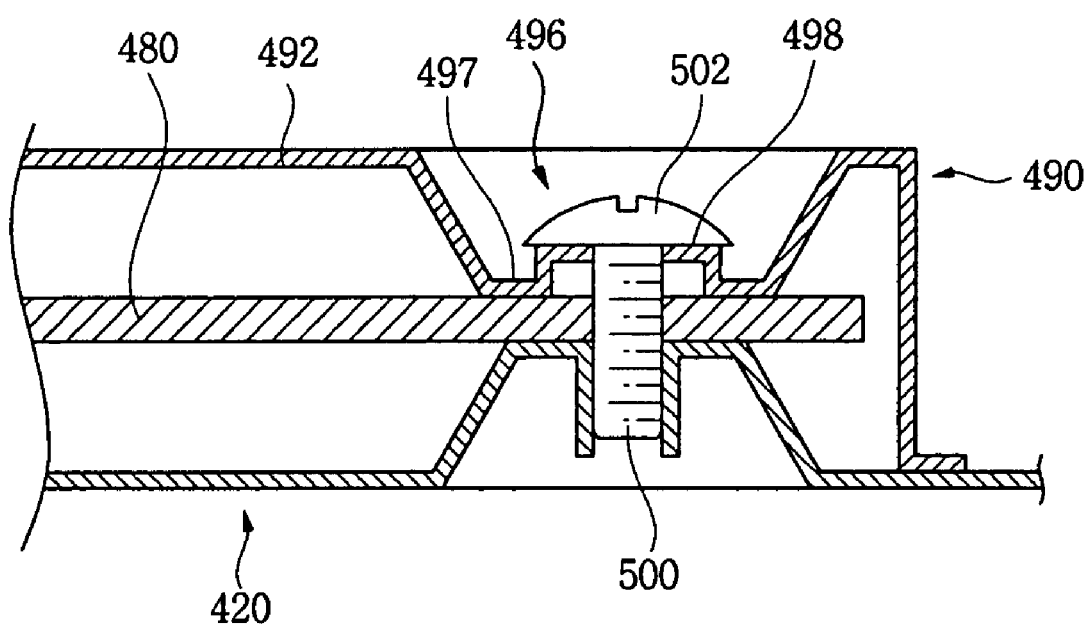
FIG. 22 is a cross sectional view for explaining one example of the surface in the liquid crystal display of FIG. 15 in more detail.

FIG. 22 is a cross sectional view for explaining one example of the surface in the liquid crystal display of FIG. 15 in more detail. The fastening structure as shown in FIG. 22 is identical to the fastening structure as shown in FIGS. 18 to 21 except for the formation direction of the second depressed portion of the first cover shield, so only the features thereof will be described.

Referring to FIG. 22, in a back surface fastening structure of the liquid crystal display according to one embodiment of the present invention, a bottom cover 420, a bottom cover 420, an inverter substrate 480, and a first cover shield 490 may be fastened by same screws 500.

In the first cover shield 490, at least two depressed portions may be formed at a first fastening portion 496 fastened to the bottom cover 420 and the inverter substrate 480 in order to commoditize the screws 500 and prevent a crack.

For example, in the first cover shield 490, a first depressed portion 497 may be formed which is retracted in the direction of the inverter substrate 480 from the body portion 492 of the first cover shield. Further, a second depressed portion 498 may be formed which extends from the first depressed portion 497 and is retracted in the direction of the body portion 492 from the first depressed portion 497. At this time, the first depth from the body portion 492 to the first depressed portion 497 in the first cover shield 490 may be greater than the second depth between the first and second depressed portions 497 and 498.

Due to this, the first depressed portion 497 may be contacted with the inverter substrate 480, and the second depressed portion 498 may be contacted with head portions 502 of the screws 500. Here, the head portions 502 of the screws 500 may not be projected outward from the body portion 492 by the first depressed portion 497.

The first and second depressed portions 497 and 498 may be formed by first and second press processes of the first cover shield 490 formed of metal material, respectively.

The second depressed portion 498 formed by the second press process may be divided into at least two.

Although the embodiment of the present invention has been described with reference to accompanying drawings, those skilled in the art can appreciate that the present invention may be implemented in some other concrete forms without departing from the technical sprit of the present invention or modifying the essential features of the present invention.

Accordingly, since the above-described embodiment is provided to fully notify those skilled in the art of the scope of the present invention, it must be appreciated that the embodiment is illustrative in all aspects, but not restrictive. The present invention is defined only by the appended claims.

What is claimed is:

1. A liquid crystal display, comprising:
   a liquid crystal panel;
   a bottom cover disposed on the back surface of the liquid crystal panel and mounting and supporting the liquid crystal panel;
   a printed circuit board disposed on the back surface of the bottom cover; and
   a cover shield fastened to the bottom cover and the printed circuit board so as to cover the printed circuit board and comprising at least two depressed portions at a fastening portion fastened to the bottom cover and the printed circuit board.

2. The liquid crystal display of claim 1, wherein burring holes of the bottom cover formed at the fastening portion for fastening, through holes of the printed circuit board, and through holes of the cover shield are formed at the bottom cover, the printed circuit board, and the cover shield, respectively.

3. The liquid crystal display of claim 2, wherein the cover shield comprises:
   a body portion;
   a first depressed portion formed in the fastening portion so as to be retracted in the direction of the printed circuit board from the body portion; and
   a second depressed portion formed in the fastening portion so as to be retracted in the direction of the printed circuit board from the first depressed portion.

4. The liquid crystal display of claim 3, wherein the second depressed portion is divided into at least two.

5. The liquid crystal display of claim 3, wherein the first depth from the body portion to the first depressed portion is greater than the second depth between the first and second depressed portions.

6. The liquid crystal display of claim 3, wherein the first depressed portion is contacted with head portions of screws passing through the burring holes of the bottom cover, the through holes of the printed circuit board, and the through holes of the cover shield, respectively, for fastening, and the second depressed portion is contacted with the printed circuit board.

7. The liquid crystal display of claim 2, wherein the cover shield comprises:
   a body portion;
   a first depressed portion formed in the fastening portion so as to be retracted in the direction of the printed circuit board from the body portion; and
   a second depressed portion formed in the fastening portion so as to be retracted in the direction of the body portion from the first depressed portion.

8. The liquid crystal display of claim 7, wherein the second depressed portion is divided into at least two.

9. The liquid crystal display of claim 7, wherein the first depth from the body portion to the first depressed portion is greater than the second depth between the first and second depressed portions.

10. The liquid crystal display of claim 7, wherein the first depressed portion is contacted with the printed circuit board, and the second depressed portion is contacted with head portions of screws passing through the burring holes of the bottom cover, the through holes of the printed circuit board, and the through holes of the cover shield, respectively, for fastening.

11. The liquid crystal display of claim 1, wherein circuit parts for driving the liquid crystal display panel are mounted on the printed circuit board.

12. The liquid crystal display of claim 1, further comprising:
   a light source stored in the bottom cover and providing light to the liquid crystal panel.

13. The liquid crystal display of claim 12, wherein circuit parts for driving the light source are mounted on the printed circuit board.

* * * * *